US010331163B1

(12) United States Patent
Luo

(10) Patent No.: US 10,331,163 B1
(45) Date of Patent: Jun. 25, 2019

(54) SUPERCONDUCTING INTEGRATED CIRCUITS WITH CLOCK SIGNALS DISTRIBUTED VIA INDUCTIVE COUPLING

(71) Applicant: Microsoft Technology Licensing, LLC, Redmond, WA (US)

(72) Inventor: Henry Y. Luo, Baltimore, MD (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/935,903

(22) Filed: Mar. 26, 2018

(51) Int. Cl.
| | |
|---|---|
| *H03K 3/00* | (2006.01) |
| *G06F 1/10* | (2006.01) |
| *H01L 39/22* | (2006.01) |
| *H03K 5/15* | (2006.01) |
| *H03K 19/195* | (2006.01) |
| *G01R 33/035* | (2006.01) |
| *H03K 3/38* | (2006.01) |

(52) U.S. Cl.
CPC ............ *G06F 1/10* (2013.01); *G01R 33/0356* (2013.01); *G01R 33/0358* (2013.01); *H01L 39/223* (2013.01); *H03K 3/38* (2013.01); *H03K 5/15013* (2013.01); *H03K 19/1952* (2013.01)

(58) Field of Classification Search
CPC ....... G06N 99/002; H03K 3/38; H01L 39/223
See application file for complete search history.

(56) References Cited

U.S. PATENT DOCUMENTS 9,520,180 B1 * 12/2016 Mukhanov .............. G11C 11/44
9,543,959 B1 1/2017 Carmean et al.

* cited by examiner

*Primary Examiner* — Sibin Chen
(74) *Attorney, Agent, or Firm* — Ranjeev Singh; Singh Law, PLLC

(57) ABSTRACT

Superconducting integrated circuits with clock signals distributed via an inductive coupling and related methods are provided. A method includes providing a D flip-flop having a clock terminal coupled to receive clock pulses from a clock line, a data input terminal, and a data output terminal. The D flip-flop may further include a first Josephson junction (JJ) coupled between a first terminal and a second terminal. The D flip-flop may further include a superconducting quantum interference device (SQUID) coupled between a third terminal and a fourth terminal, where an inductive loop, formed between the first JJ and the SQUID, is configured to in response to receiving a first clock pulse, store a fluxon when a state of the input data signal is high, and is configured to in response to receiving a second clock pulse to annihilate the stored fluxon when a state of the input data signal is low.

20 Claims, 3 Drawing Sheets

SUPERCONDUCTING INTEGRATED CIRCUITS WITH CLOCK SIGNALS DISTRIBUTED VIA INDUCTIVE COUPLING

BACKGROUND

Semiconductor based integrated circuits used in electronic devices, such as digital processors, include digital circuits based on complimentary metal-oxide semiconductor (CMOS) technology. CMOS technology, however, is reaching its limits in terms of the device size. In addition, power consumption at high clock speeds by digital circuits based on the CMOS technology has increasingly become a limiting factor in high performance digital circuits and systems.

As an example, servers in a data center are increasingly consuming large amounts of power. The consumption of power is partly the result of power loss from the dissipation of energy even when the CMOS circuits are inactive. This is because even when such circuits are inactive, and are not consuming any dynamic power, they still consume power because of the need to maintain the state of CMOS transistors. In addition, because CMOS circuits are powered using DC voltage, there is a certain amount of current leakage even when the CMOS circuits are inactive. Thus, even when such circuits are not processing information, a certain amount of power is wasted not only as a result of the requirement to maintain the state of the CMOS transistors, but also as a result of the current leakage.

An alternative approach to the use of processors, and related components, based on CMOS technology, is the use of superconducting logic based devices.

SUMMARY

In one example, the present disclosure relates to an integrated circuit including at least one D flip-flop configured to receive a clock signal, receive an input data signal, and provide an output data signal. The integrated circuit may further include a clock line coupled to provide the clock signal to the at least one D flip-flop. The integrated circuit may further include a return clock line, wherein the clock line and the return clock line are connected across a stacked driver to provide current for driving the clock signal. The integrated circuit may further include a D flip-flop. The D flip-flop may include a clock terminal coupled for receiving the clock signal via the clock line, a data input terminal coupled for receiving the input data signal from a data line, and a data output terminal coupled to provide the output data signal.

The D flip-flop may further include a first inductor coupled between the data input terminal and a first terminal, a first Josephson junction (JJ) coupled between the first terminal and a second terminal. The D flip-flop may further include a second inductor coupled between the first terminal and a third terminal and a superconducting quantum interference device (SQUID) coupled between the third terminal and a fourth terminal, where an inductive loop, formed between the first JJ and the SQUID, is configured to in response to receiving a first clock pulse via the clock line, store a fluxon when a state of the input data signal is high, and where the inductive loop is configured to in response to receiving a second clock pulse via the clock line to annihilate the stored fluxon when a state of the input data signal is low.

In another aspect, the present disclosure relates to a providing a clock distribution network, including a clock line coupled to provide a clock signal comprising clock pulses. The method may further include providing at least one D flip-flop having a clock terminal coupled for receiving the clock signal via the clock line, a data input terminal coupled for receiving an input data signal, and a data output terminal coupled to provide an output data signal. The D flip-flop may further include a first inductor coupled between the data input terminal and a first terminal, a first Josephson junction (JJ) coupled between the first terminal and a second terminal. The D flip-flop may further include a second inductor coupled between the first terminal and a third terminal and a superconducting quantum interference device (SQUID) coupled between the third terminal and a fourth terminal, where an inductive loop, formed between the first JJ and the SQUID, is configured to in response to receiving a first clock pulse via the clock line, store a fluxon when a state of the input data signal is high, and where the inductive loop is configured to in response to receiving a second clock pulse via the clock line to annihilate the stored fluxon when a state of the input data signal is low.

In yet another aspect, the present disclosure relates to an integrated circuit including a plurality of data lines for carrying data signals. The integrated circuit may further include a plurality of clock lines for carrying clock signals, where each of the plurality of clock lines is configured as an inductive line such that each of the plurality of clock lines does not include any Josephson transmission line (JTL) components for driving any of the clock signals. The integrated circuit may further include at least one D flip-flop. The D flip-flop may further include a clock terminal coupled for receiving the clock signal via the clock line, a data input terminal coupled to receive an input data signal, and a data output terminal coupled to provide an output data signal. The D flip-flop may further include a first inductor coupled between the data input terminal and a first terminal, a first Josephson junction (JJ) coupled between the first terminal and a second terminal. The D flip-flop may further include a second inductor coupled between the first terminal and a third terminal and a superconducting quantum interference device (SQUID) coupled between the third terminal and a fourth terminal, where an inductive loop, formed between the first JJ and the SQUID, is configured to in response to receiving a first clock pulse via the clock line, store a fluxon when a state of the input data signal is high, and where the inductive loop is configured to in response to receiving a second clock pulse via the clock line to annihilate the stored fluxon when a state of the input data signal is low.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1B:
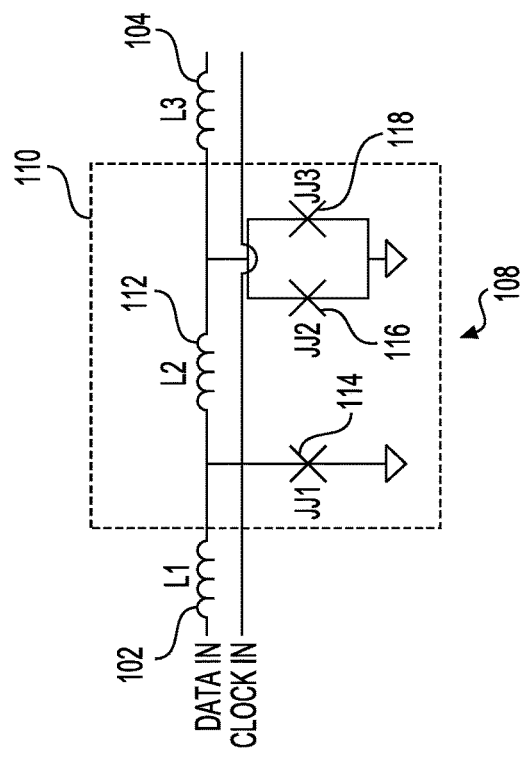
FIG. 1A shows phase-mode logic waveforms and FIG. 1B shows an operating environment for a D flip-flop in accordance with one example.

Examples described in this disclosure relate to superconducting integrated circuits with clock signals distributed via inductive coupling. Certain examples further relate to superconducting circuits including superconducting devices like D flip-flops. Certain examples include transmission lines (e.g., inductive lines) that do not use Josephson transmission lines (JTLs). The use of inductive coupling may advantageously allow incorporation of various more efficient clock distribution schemes in the superconducting integrated circuits. As an example, in situations where clock latency may not be a large concern, the clock signals could be provided using a single inductive line connected to a pad. The clock signals may even be driven using clock drivers that are located off the superconducting integrated circuit, which in turn may allow the chip area that is not being used by clock drivers to be used for other purposes. As an example, the number of the logic circuits located on the same sized integrated circuit chip may even be higher. The clock signals may be driven using various ways, as long as they allow current to be driven on to the inductive clock line. As an example, both alternating current (AC) biased drivers and direct current (DC) based drivers may be used. As another example, off-chip clock drivers may be used to drive Wilkinson splitters to provide the clock signals.

In addition, because the inductive lines for distributing clock signals can be differential, this may advantageously allow the drivers to be stacked. The stacked drivers may be AC-biased or DC-biased. The use of stacked drivers may result in savings in terms of the chip layout required to route conductors for carrying the clock signals. These superconducting devices may also use phase-mode logic (PML) based devices. In the PML based devices, a logical '1' may be encoded as a phase high and a logical '0' may be encoded as phase low. The transitions between phase high and phase low may be event-triggered by single flux quantum (SFQ) pulses as described later. Such PML based devices may include PML circuits that may act as low-power superconductor logic circuits. Unlike CMOS transistors, the PML circuits are superconductor circuits that use Josephson junction based devices. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the PML circuits. As an example, superconductors are materials that can carry a direct electrical current (DC) in the absence of an electric field. Such materials have almost zero resistance. Niobium, an example superconductor, has a critical temperature (Tc) of 9.3 Kelvin. At temperatures below Tc, Niobium is superconductive; however, at temperatures above Tc, it behaves as a normal metal with electrical resistance. Thus, in the SIS type of Josephson junctions, superconductors may be Niobium superconductors and insulators may be $Al_2O_3$ barriers. In SIS type of junctions, when a wave function tunnels through the barrier, a changing phase difference in time in the two superconductors creates a potential difference between the two superconductors. In PML circuits, in one example, the SIS type of junction may be part of a superconducting loop. When the potential difference between the two superconductors is integrated with respect to time over one cycle of phase change, the magnetic flux through the loop changes by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In PML circuits, each Josephson junction may be part of one or more superconducting loops. The phase difference across the junction may be modulated by the magnetic flux applied to the loop.

Various PML circuits including transmission lines can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The PML circuits may advantageously have zero static power dissipation because of the absence of bias resistors. In addition, at least some of the components of the PML circuits may be powered using alternating current (AC) power thereby eliminating the ground return current.

The building blocks of exemplary PML circuits may include various types of logic gates. Exemplary logic gates, include an AND gate, an OR gate, a logical A-and-not-B gate and a logical AND & OR (AND/OR) gate. The A-and-not-B gate may have two inputs and one output (Q). An input pulse A may propagate to output Q unless an input pulse B comes first. The AND/OR gate may have two inputs and two outputs (Q1 and Q2). One output (e.g., Q1) may provide a logical OR output and the other output (e.g., Q2) may provide a logical AND output.

Figure 1A:
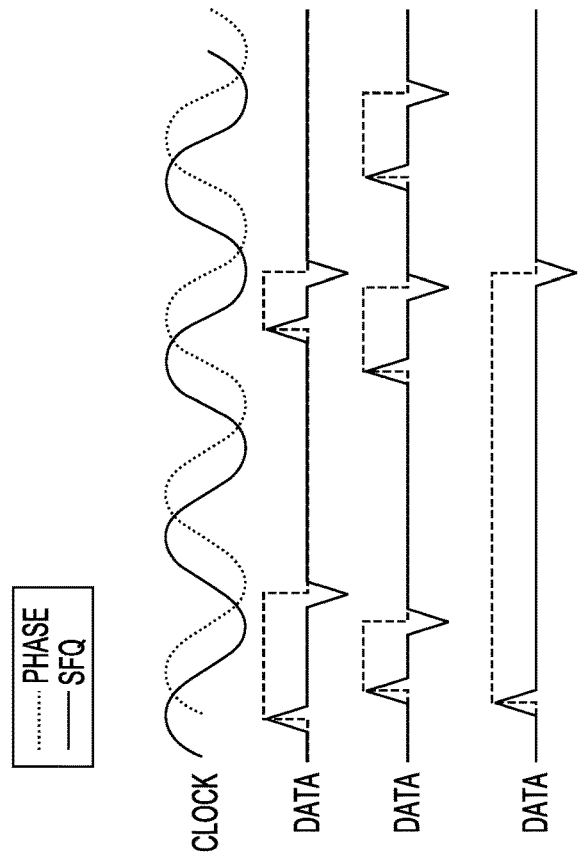

FIG. 1A shows phase-mode logic waveforms and FIG. 1B shows an operating environment 100 for a D flip-flop 110 in accordance with one example. In phase-mode logic, digital values may be encoded as Josephson junction (JJ) phase. A high phase may indicate a logic '1' and a low phase may indicate a logic '0.' Unlike reciprocal quantum logic (RQL) encoding, these values are persistent across RQL clock cycles because there is no requirement for a reciprocal pulse to reset the JJ phase. As an example, if an AC clock, with four phases, were used to power the phase-mode logic circuit, the output of the phase-mode logic circuit may be persistent across all four phases of the AC clock. Thus, advantageously, the persistent nature of this data encoding may be leveraged into circuits that are like CMOS logic in terms of their behavior in response to a clock. To illustrate an example of the phase-mode logic, FIG. 1A shows the behavior of a non-phase-mode logic and the behavior of the phase-mode logic based on the same clock (Resonator Clock). The Resonator Clock may be a sinusoidal clock that may provide AC power to the superconducting logic circuits that comprise the phase-mode logic devices. FIG. 1A shows two such clocks that can provide a four-phase clock. In one example, cross-wired transformers (not shown) may be used to produce a four-phase clock from two Resonant Clocks. For example, by coupling the clock lines to the Josephson junctions in the gates of a respective superconducting circuit in a wound or counter-wound fashion, four phases of clock may be derived. The four phases of the clock may provide directionality to the single flux quantum (SFQ) pulses. Thus, as an example, with respect to a four-phase clock, the positive pulse may ride the leading edge of the clock from one phase to the next and arrive at the output after one cycle of delay and the negative pulse may follow with half a cycle of separation. As shown in FIG. 1A, the three data signal waveforms show the RQL waveforms in solid lines and the phase-mode logic waveforms are shown in dotted lines. The data signals are persistent across at least one clock cycle.

Phase-mode logic may use modified versions of superconducting logic gates, e.g., reciprocal quantum logic (RQL) gates. Some of these gates may be used as part of general combinational logic built using these gates, while others may only be used within state elements. Combinational logic using phase-mode logic may be designed using gates, such as AND/OR gates that provide the basic Boolean functions. In one example, both inputs to such gates must be phase aligned. In other words, the two inputs must arrive in the same phase at the inputs, but they may be allowed to arrive on different resonator clock cycles.

With continued reference to FIG. 1A and FIG. 1B, any of the data signals shown in FIG. 1A may be received by D flip-flop 110 via a DATA IN terminal. The data signals may be driven by Josephson transmission line (JTL) components. An inductor L1 102 may be coupled to receive the input data signal. The clock signal may be received by D flip-flop 110 via the CLOCK IN terminal. As shown in FIG. 1A, the clock signal may be a sinusoidal clock signal. Alternatively, the clock signal may be a series of pulses or other types of signals that can be used for controlling the timing of the various aspects of D flip-flop 110. In this example, the clock line shown in FIG. 1B (e.g., the line between the CLOCK IN terminal and the CLOCK OUT terminal) may be an inductive line; thus, this clock line does not use an JTLs for receiving, transmitting, and distributing the clock signals to any of the devices, including, for example, D flip-flop 110. D flip-flop 110 may include a Josephson junction JJ1 114 coupled between inductor L1 102 and another inductor L2 112. D flip-flop 110 may further include another inductor L3 104 through which the data output may be provided via the DATA OUT terminal. A superconducting quantum interference device (SQUID) including JJ2 116 and JJ3 118 may be coupled between inductor L2 112 and inductor L3 104 as shown in FIG. 1B. The clock signal received via the CLOCK IN terminal may be output via the CLOCK OUT terminal. Although FIG. 1B shows a certain number of components of D flip-flop 110 arranged in a certain manner, there could be more or fewer number of components arranged differently.

In terms of the operation of D flip-flop 110, in one example, assuming the D flip-flop is in the logic "0" state, when the input signal (e.g., the signal received via the DATA IN terminal) is high, the input Josephson junction JJ1 114 may trigger. In this example, the triggering of Josephson junction JJ1 114 puts a fluxon (e.g., a single flux quanta) clockwise into the inductive loop formed using inductor L2 112 and the SQUID. In this example, at this point, the state of the data output signal at the DATA OUT terminal is still low. A clock pulse received via the CLOCK IN terminal will lower the critical current of the SQUID comprising Josephson junction JJ2 116 and Josephson junction JJ3 118. As part of this example, that in turn causes the SQUID to trigger due to the current flowing through the SQUID from the fluxon in the inductive loop formed using inductor L2 112 and the SQUID. This may result in the SQUID annihilating the fluxon in the inductor loop, and that may result in the sending of a high signal to the DATA OUT terminal via inductor L3 104. On the other hand, when the input signal received via the DATA IN terminal is low and the SQUID is in the 0 state, in this example, there is no current flow in the inductive loop formed by inductor L1 102; thus, a clock pulse received via the CLOCK IN terminal will not change the state of the SQUID.

In terms of the operation of D flip-flop 110, in this example, assuming the D flip-flop is in the logic "1" state, when the input signal is low (e.g., the signal received via the DATA IN terminal), and the SQUID is in the logic "1" state, there is a current flowing counter clockwise through the inductor L2 112. When a clock pulse is received via the CLOCK IN terminal, in this example, it will lower the critical current of the SQUID including Josephson junction JJ2 116 and Josephson junction JJ3 118. This in turn may cause the SQUID to trigger due to the current flowing through the SQUID from the fluxon in the inductive loop formed with inductor L2 112. As a result, the SQUID will transition into the "0" state since it has been triggered in the counter clock wise direction. Consequently, in this example, the SQUID may annihilate the fluxon in inductor L2 112; and as a result, a data low signal is output via the DATA OUT terminal. On the other hand, when the input signal is high (e.g., the signal received via the DATA IN terminal), and the SQUID is in the logic "1" state, there is no current flowing through the inductor L2 112; thus, a clock pulse received via the CLOCK IN terminal will not change the state of the SQUID.

Clock line used for driving the clock signal to the CLOCK IN terminal of D flip-flop 110, shown in FIG. 1B, may be an inductive line that does not use any Josephson transmission line (JTL) components for driving the clock signal. Alternatively, or additionally, a clock distribution network including transmission lines may be used to distribute clock signals; and the transmission lines may not use any Josephson transmission line (JTL) components for driving the clock signals. In the absence of the JTLs, the inductive lines or the transmission lines can be differential, this may advantageously allow the drivers to be stacked. That in turn may result in savings in terms of the chip layout required to route conductors for carrying the clock signals. Additional details for using stacked drivers with the inductive clock transmission lines are provided with respect to FIGS. 3 and 4.

Figure 2:
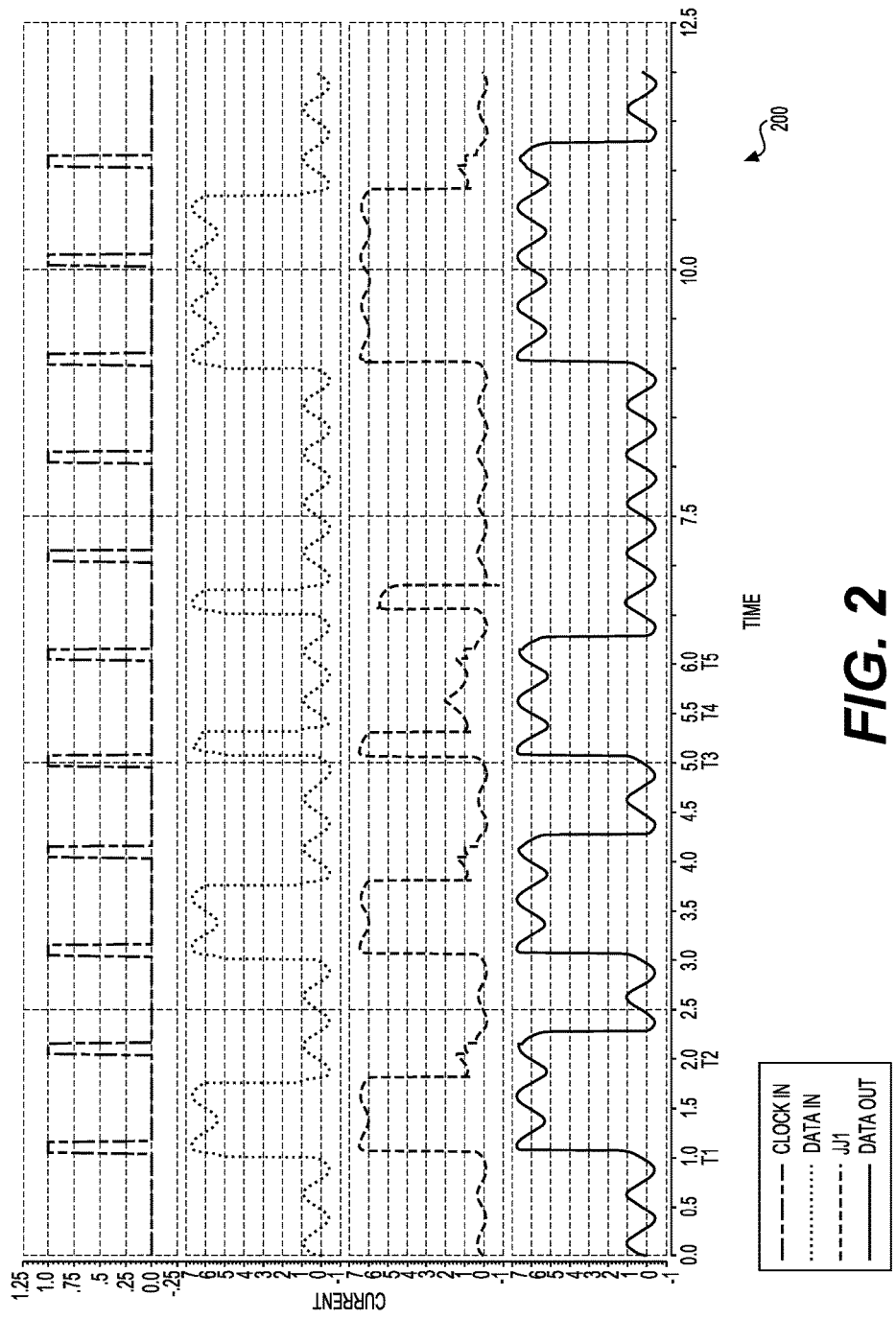
FIG. 2 shows waveforms corresponding to the D flip-flop of FIG. 1B in accordance with one example.

FIG. 2 shows waveforms 200 corresponding to D flip-flop 110 of FIG. 1B in accordance with one example. CLOCK IN terminal receives and transmits the clock signal (CLOCK), which in this example is a series of pulses. As shown in FIG. 2, at time T1, a logic "1" is being written to the D flip-flop 110. This is because at time T1 each of the input data signal and the clock signal received via the CLOCK IN terminal is a logic high signal. At time T2, a logic "0" is being written to D flip-flop 110. This is because at time T2, the input data signal is a logic low signal and the clock signal is a logic high signal. At time T3, a logic "1" is written to D flip-flop 110 (clock signal is a logic high signal and input data signal is a logic low signal). At time T4, the output data signal of D flip-flop 110 stays high when input data signal is a logic low signal; then, at time T5, a logic "0" is written to D flip-flop 110 and the output data signal changes its state to a logic low signal.

As explained earlier, by not using Josephson transmission line (JTL), the clock line now can be a transmission line or an inductive line. This, in turn, may advantageously allow the use of stacked drivers as explained with respect to FIGS. 3 and 4. Stacked drivers may be DC-biased.

Figure 3:
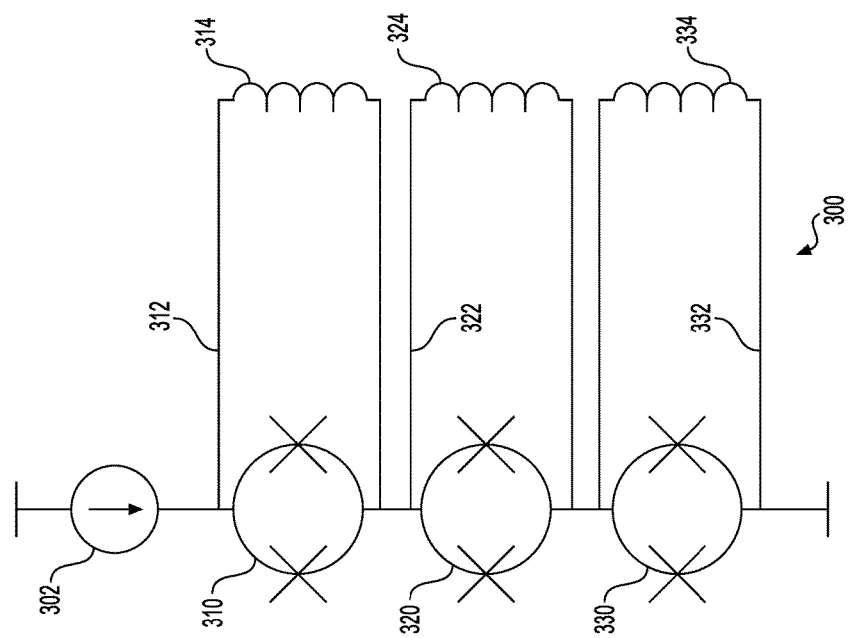
FIG. 3 shows a diagram of a superconducting circuit including the D flip-flop of FIG. 1B with stacked drivers in accordance with one example.

FIG. 3 shows a diagram of a superconducting circuit 300 including the D flip-flop of FIG. 1B with stacked drivers in accordance with one example. A current source 302 may be configured to provide current to a series of stacked drivers. Stacked driver 310, which includes two Josephson junctions, may be used to drive an inductive line 312, where the inductance of the line is represented by inductor 314. Similarly, stacked driver 320, which includes two Josephson junctions, may be used to drive an inductive line 322, where the inductance of the line is represented by inductor 324. In addition, stacked driver 330, which includes two Josephson junctions, may be used to drive an inductive line 332, where the inductance of the line is represented by inductor 334.

Figure 4:
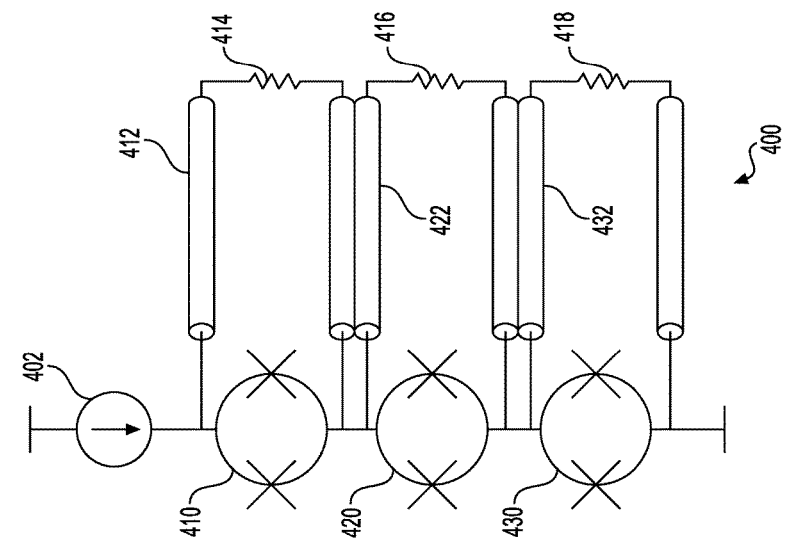
FIG. 4 shows a diagram of a superconducting circuit including the D flip-flop of FIG. 1B with stacked drivers in accordance with one example.

FIG. 4 shows a diagram of a superconducting circuit 400 including the D flip-flop of FIG. 1B with stacked drivers in accordance with one example. A current source 402 may be configured to provide current to a series of stacked drivers. Stacked driver 410, which includes two Josephson junctions, may be used to drive a transmission line 412, where the resistance of the line is represented by resistor 414. Similarly, stacked driver 420, which includes two Josephson junctions, may be used to drive a transmission line 422, where the resistance of the line is represented by resistor 416. In addition, stacked driver 430, which includes two Josephson junctions, may be used to drive a transmission line 432, where the resistance of the line is represented by resistor 418. Although FIGS. 3 and 4 provide stacked drivers, unstacked drivers may also be used. Unstacked drivers may be DC-biased or AC-biased.

As described earlier, inductive clock lines do not use any Josephson transmission line (JTL) components for driving the clock signal. Alternatively, or additionally, a clock distribution network including transmission lines may be used to distribute clock signals; and the transmission lines may not use any Josephson transmission line (JTL) components for driving the clock signals. In the absence of the JTLs, the inductive lines or the transmission lines can be differential, this may advantageously allow the drivers to be stacked. That in turn may result in savings in terms of the chip layout required to route conductors for carrying the clock signals. The use of inductive coupling may also advantageously allow for incorporation of more efficient clock distribution schemes in the superconducting integrated circuits. As an example, in situations where clock latency may not be a large concern, the clock signals could be provided using a single inductive line connected to a pad. The clock signals may even be driven using clock drivers that are located off the superconducting integrated circuit, which in turn may allow the chip area that is not being used by clock drivers to be used for other purposes. As an example, the number of the logic circuits located on the same sized integrated circuit chip may even be higher. The clock signals may be driven using various ways, as long as they allow current to be driven on to the inductive clock line. As an example, both alternating current (AC) biased drivers and direct current (DC) based drivers may be used. As another example, off-chip clock drivers may be used to drive Wilkinson splitters to provide the clock signals.

In conclusion, the present disclosure relates to an integrated circuit including at least one D flip-flop configured to receive a clock signal, receive an input data signal, and provide an output data signal. The integrated circuit may further include a clock line coupled to provide the clock signal to the at least one D flip-flop and. The integrated circuit may further include a return clock line, wherein the clock line and the return clock line are connected across a stacked driver to provide current for driving the clock signal. The integrated circuit may further include a D flip-flop. The D flip-flop may include a clock terminal coupled for receiving the clock signal via the clock line, a data input terminal coupled for receiving the input data signal from a data line, and a data output terminal coupled to provide the output data signal.

The D flip-flop may further include a first inductor coupled between the data input terminal and a first terminal, a first Josephson junction (JJ) coupled between the first terminal and a second terminal. The D flip-flop may further include a second inductor coupled between the first terminal and a third terminal and a superconducting quantum interference device (SQUID) coupled between the third terminal and a fourth terminal, where an inductive loop, formed between the first JJ and the SQUID, is configured to in response to receiving a first clock pulse via the clock line, store a fluxon when a state of the input data signal is high, and where the inductive loop is configured to in response to receiving a second clock pulse via the clock line to annihilate the stored fluxon when a state of the input data signal is low.

The clock line may be coupled to receive the clock signal from at least one of an off-chip clock driver or a Wilkinson splitter driven by an off-chip driver. The clock line may be an inductive line. The integrated circuit may include a clock distribution network for distributing the clock signals, and the clock line may one or more of transmission lines each of which is configured to create the distribution network. The clock line may not include any Josephson junction transmission line (JTL) components for driving the clock signal.

The SQUID may include a second Josephson junction (JJ) coupled between the third terminal and the fourth terminal and a third Josephson junction (JJ) coupled between the third terminal and the fourth terminal.

Each of the stacked drivers may be a DC-biased stacked driver.

In another aspect, the present disclosure relates to a providing a clock distribution network, including a clock line coupled to provide a clock signal comprising clock pulses. The method may further include providing at least one D flip-flop having a clock terminal coupled for receiving the clock signal via the clock line, a data input terminal coupled for receiving the input data signal from a data line, and a data output terminal coupled to provide the output data signal. The D flip-flop may further include a first inductor coupled between the data input terminal and a first terminal, a first Josephson junction (JJ) coupled between the first terminal and a second terminal. The D flip-flop may further include a second inductor coupled between the first terminal and a third terminal and a superconducting quantum interference device (SQUID) coupled between the third terminal and a fourth terminal, where an inductive loop, formed between the first JJ and the SQUID, is configured to in response to receiving a first clock pulse via the clock line, store a fluxon when a state of the input data signal is high, and where the inductive loop is configured to in response to receiving a second clock pulse via the clock line to annihilate the stored fluxon when a state of the input data signal is low.

The clock line may be coupled to receive the clock signal from at least one of an off-chip clock driver or a Wilkinson splitter driven by an off-chip driver. The clock line may be an inductive line. The clock line may be coupled to receive the clock signal from a direct current (DC) biased stacked driver. The clock line may be coupled to receive the lock signal via an alternating current (AC) biased driver.

In yet another aspect, the present disclosure relates to an integrated circuit including a plurality of data lines for carrying data signals. The integrated circuit may further include a plurality of clock lines for carrying clock signals, where each of the plurality of clock lines is configured as an inductive line such that each of the plurality of clock lines does not include any Josephson transmission line (JTL) components for driving any of the clock signals. The integrated circuit may further include at least one D flip-flop. The D flip-flop may further include a clock terminal coupled for receiving the clock signal via the clock line, a data input terminal coupled for receiving the input data signal from a data line, and a data output terminal coupled to provide the output data signal. The D flip-flop may further include a first inductor coupled between the data input terminal and a first terminal, a first Josephson junction (JJ) coupled between the first terminal and a second terminal. The D flip-flop may further include a second inductor coupled between the first terminal and a third terminal and a superconducting quantum interference device (SQUID) coupled between the third terminal and a fourth terminal, where an inductive loop, formed between the first JJ and the SQUID, is configured to in response to receiving a first clock pulse via the clock line, store a fluxon when a state of the input data signal is high, and where the inductive loop is configured to in response to receiving a second clock pulse via the clock line to annihilate the stored fluxon when a state of the input data signal is low.

The clock line may be coupled to receive the clock signal from at least one of an off-chip clock driver or a Wilkinson splitter driven by an off-chip driver. The clock line may be an inductive line. The clock line may be coupled to receive the clock signal from a direct current (DC) biased stacked driver. The clock line may be coupled to receive the lock signal via an alternating current (AC) biased driver.

It is to be understood that the methods, modules, and components depicted herein are merely exemplary. Alternatively, or in addition, the functionally described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with the examples described in this disclosure can also include instructions stored in a non-transitory media. The term "non-transitory media" as used herein refers to any media storing data and/or instructions that cause a machine, such as a processor, to operate in a specific manner. Exemplary non-transitory media include non-volatile media and/or volatile media. Non-volatile media include, for example, a hard disk, a solid-state drive, a magnetic disk or tape, an optical disk or tape, a flash memory, an EPROM, NVRAM, PRAM, or other such media, or networked versions of such media. Volatile media include, for example, dynamic memory, such as, DRAM, SRAM, a cache, or other such media. Non-transitory media is distinct from, but can be used in conjunction with transmission media. Transmission media is used for transferring data and/or instruction to or from a machine. Exemplary transmission media, include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. An integrated circuit comprising:
   at least one D flip-flop configured to receive a clock signal, receive an input data signal, and provide an output data signal;
   a clock line coupled to provide the clock signal to the at least one D flip-flop; and
   a return clock line, wherein the clock line and the return clock line are connected across a stacked driver to provide current for driving the clock signal, and wherein the at least one D flip-flop further comprises:
   a clock terminal coupled for receiving the clock signal via the clock line,
   a data input terminal coupled for receiving the input data signal,
   a data output terminal coupled to provide the output data signal,
   a first inductor coupled between the data input terminal and a first terminal, a first Josephson junction (JJ) coupled between the first terminal and a second terminal, and
   a second inductor coupled between the first terminal and a third terminal and a superconducting quantum interference device (SQUID) coupled between the third terminal and a fourth terminal, wherein an inductive loop, formed between the first JJ and the SQUID, is configured to in response to receiving a first clock pulse via the clock line, store a fluxon when a state of the input data signal is high, and wherein the inductive loop is configured to in response to receiving a second clock pulse via the clock line to annihilate the stored fluxon when a state of the input data signal is low.

2. The integrated circuit of claim 1, wherein the clock line is coupled to receive the clock signal from at least one of an off-chip clock driver or a Wilkinson splitter driven by an off-chip driver.

3. The integrated circuit of claim 1, wherein the SQUID comprises a second Josephson junction (JJ) coupled between the third terminal and the fourth terminal and a third Josephson junction (JJ) coupled between the third terminal and the fourth terminal.

4. The integrated circuit of claim 1, wherein the clock line is an inductive line.

5. The integrated circuit of claim 1 further comprising a clock distribution network for distributing the clock signals, and wherein the clock line is one or more of transmission lines that are configured to create the distribution network.

6. The integrated circuit of claim 1, wherein the clock line does not include any Josephson junction transmission line (JTL) components for driving the clock signal.

7. The integrated circuit of claim 1, wherein each of stacked drivers is a DC-biased stacked driver.

8. A method comprising:
providing a clock distribution network, including a clock line coupled to provide a clock signal comprising clock pulses; and
providing at least one D flip-flop including:
a clock terminal coupled for receiving the clock signal via the clock line,
a data input terminal coupled for receiving an input data signal,
a data output terminal coupled to provide an output data signal,
a first inductor coupled between the data input terminal and a first terminal, a first Josephson junction (JJ) coupled between the first terminal and a second terminal, and
a second inductor coupled between the first terminal and a third terminal and a superconducting quantum interference device (SQUID) coupled between the third terminal and a fourth terminal, wherein an inductive loop, formed between the first JJ and the SQUID, is configured to in response to receiving a first clock pulse via the clock line, store a fluxon when a state of the input data signal is high, and wherein the inductive loop is configured to in response to receiving a second clock pulse via the clock line to annihilate the stored fluxon when a state of the input data signal is low.

9. The method of claim 8, wherein the clock line is coupled to receive the clock signal from at least one of an off-chip clock driver or a Wilkinson splitter driven by an off-chip clock driver.

10. The method of claim 9, wherein the clock line does not include any Josephson junction transmission line (JTL) components for driving the clock signal.

11. The method of claim 8, wherein the clock line is coupled to receive the clock signal from a direct current (DC) biased stacked driver.

12. The method of claim 8, wherein the clock line is coupled to receive the clock signal from a logical clock resonator.

13. The method of claim 8, wherein the clock line is coupled to receive the clock signal via an alternating current (AC) biased driver.

14. The method of claim 8, wherein the clock line is an inductive line.

15. An integrated circuit comprising:
a plurality of data lines for carrying data signals;
a plurality of clock lines for carrying clock signals, wherein each of the plurality of clock lines is configured as an inductive line such that each of the plurality of clock lines does not include any Josephson transmission line (JTL) components for driving any of the clock signals; and
at least one D flip-flop comprising:
a clock input terminal coupled to receive a clock signal from one of the plurality of clock lines,
a data input terminal coupled to receive an input data signal from one of the plurality of data lines, and
a data output terminal coupled to provide an output data signal,
a first inductor coupled between the data input terminal and a first terminal, a first Josephson junction (JJ) coupled between the first terminal and a second terminal,
a second inductor coupled between the first terminal and a third terminal and a superconducting quantum interference device (SQUID) coupled between the third terminal and a fourth terminal, wherein an inductive loop, formed between the first JJ and the SQUID, is configured to in response to receiving a first clock pulse via the clock line, store a fluxon when a state of the input data signal is high, and wherein the inductive loop is configured to in response to receiving a second clock pulse via the clock line to annihilate the stored fluxon when a state of the input data signal is low.

16. The integrated circuit of claim 15, wherein the one of the plurality of clock lines is coupled to receive the clock signal from at least one of an off-chip clock driver or a Wilkinson splitter driven by an off-chip clock driver.

17. The integrated circuit of claim 15, wherein the one of the plurality of clock lines is coupled to receive the clock signal from a direct current (DC) biased stacked driver.

18. The integrated circuit of claim 17, wherein the one of the plurality of clock lines is coupled to receive the clock signal from a logical clock resonator.

19. The integrated circuit of claim 15, wherein the one of the plurality of clock lines is coupled to receive the clock signal from an alternating current (AC) biased driver.

20. The integrated circuit of claim 15 further comprising a clock distribution network for distributing the clock signals, and wherein the one of the plurality of clock lines is a transmission line that is configured to create the distribution network.

* * * * *